(12) United States Patent
Tanner

(10) Patent No.: US 7,857,202 B2
(45) Date of Patent: Dec. 28, 2010

(54) METHOD AND APPARATUS FOR A CONTACTLESS SMARTCARD INCORPORATING A PRESSURE SENSITIVE SWITCH

(75) Inventor: Colin Tanner, Middlesex (GB)

(73) Assignee: Mastercard International, Inc., Purchase, NY (US)

( * ) Notice: Subject to any disclaimer, the term of this patent is extended or adjusted under 35 U.S.C. 154(b) by 462 days.

(21) Appl. No.: 12/048,992

(22) Filed: Mar. 14, 2008

(65) Prior Publication Data

US 2008/0217413 A1 Sep. 11, 2008

Related U.S. Application Data

(63) Continuation-in-part of application No. 11/503,197, filed on Aug. 11, 2006.

(51) Int. Cl.
*G06F 17/00* (2006.01)
(52) U.S. Cl. ............... 235/375; 235/492; 235/380; 235/487; 705/14
(58) Field of Classification Search ........... 235/492, 235/380, 487, 375; 705/14
See application file for complete search history.

(56) References Cited

U.S. PATENT DOCUMENTS

| | | | | |
|---|---|---|---|---|
| 3,927,282 | A | * 12/1975 | Firstenberg | ............ 379/447 |
| 5,821,516 | A | * 10/1998 | Vandenengel | ............ 235/441 |
| 6,863,220 | B2 | 3/2005 | Selker | |
| 2002/0170960 | A1* | 11/2002 | Ehrensvard et al. | ......... 235/380 |
| 2006/0252601 | A1* | 11/2006 | Baum | .................. 482/9 |
| 2008/0054081 | A1* | 3/2008 | Mullen | ............... 235/494 |
| 2008/0065492 | A1* | 3/2008 | Halbur et al. | ............. 705/14 |
| 2008/0149735 | A1* | 6/2008 | Kozlay | ................. 235/492 |

FOREIGN PATENT DOCUMENTS

| | | |
|---|---|---|
| EP | 1 868 140 A1 | 12/2007 |
| WO | 98/33193 A1 | 7/1998 |
| WO | 99/38173 A1 | 7/1999 |
| WO | 00/79546 A1 | 12/2000 |

* cited by examiner

*Primary Examiner*—Allyson N Trail
(74) *Attorney, Agent, or Firm*—Buckley, Maschoff & Talwalkar LLC

(57) ABSTRACT

An apparatus and method for providing a radio frequency identification (RFID) card, the card including a card inlay; an antenna positioned on the card inlay, a RFID integrated circuit (IC) on the card inlay, a pressure-sensitive switch including an electrode structure located on or in the card inlay and coupled to the antenna and the RFID IC via the electrode structure, the pressure-sensitive switch having an electrical resistance that varies with a pressure applied to the switch, and a dam of material in a vicinity around of the pressure-sensitive switch to provide a barrier against a lateral pressure being applied to the switch.

30 Claims, 4 Drawing Sheets

600

```
┌─────────────────────────────────────────┐
│ PROVIDE AN ANTENNA AND AN RFID INTEGRATED│
│        CIRCUIT (IC) ON A CARD INLAY      │
│                                     605  │
└─────────────────────────────────────────┘
                    ↓
┌─────────────────────────────────────────┐
│      PROVIDE A PRESSURE-SENSITIVE SWITCH │
│     HAVING AN ELECTRICAL RESISTANCE THAT │
│      VARIES WITH AN APPLIED PRESSURE TO  │
│      THE SWITCH ON OR IN THE CARD INLAY  │
│                                     610  │
└─────────────────────────────────────────┘
                    ↓
┌─────────────────────────────────────────┐
│        CONNECT THE PRESSURE SENSITIVE    │
│     SWITCH TO THE ANTENNA AND THE RFID IC│
│         USING AN ELECTRODE STRUCTURE     │
│                                     615  │
└─────────────────────────────────────────┘
                    ↓
┌─────────────────────────────────────────┐
│  PROVIDE A DAM OF MATERIAL IN A VICINITY │
│  AROUND THE PRESSURE-SENSITIVE SWITCH TO │
│  PROVIDE A BARRIER AGAINST A LATERAL     │
│  PRESSURE BEING APPLIED TO THE SWITCH    │
│                                     620  │
└─────────────────────────────────────────┘
                    ↓
┌─────────────────────────────────────────┐
│  LAMINATE THE CARD INLAY INCLUDING THE   │
│  ANTENNA, RFID IC, AND SWITCH BETWEEN A  │
│  TOP OUTER LAYER ADJACENT A FIRST SIDE   │
│  OF THE CARD INLAY AND A BOTTOM OUTER    │
│  LAYER ADJACENT A SECOND SIDE OF THE     │
│  CARD INLAY OPPOSING THE FIRST SIDE OF   │
│  THE CARD INLAY TO ENCLOSE THE CARD      │
│  INLAY BETWEEN THE TOP AND BOTTOM        │
│  OUTER LAYERS                            │
│                                     625  │
└─────────────────────────────────────────┘
```

*FIG. 6*

METHOD AND APPARATUS FOR A CONTACTLESS SMARTCARD INCORPORATING A PRESSURE SENSITIVE SWITCH

BACKGROUND

A contactless smartcard may be used to implement a proximity payment card in some instances or as an identity card in other implementations. A contactless smartcard may typically include a radio frequency identification (RFID) integrated circuit (IC) embedded in a card-shaped plastic body. An antenna may also be embedded in the card body to receive a power signal from a card reader such as, for example, a point of sale terminal. The antenna may also be used by the RFID IC to transmit an account number, cardholder identification, and other information to the POS terminal or other card reader.

A contactless smartcard including a user-actuated switch may offer operational advantages such as enhanced security features. In some instances, a user may need to actuate the switch in order to activate the smartcard so that the smartcard may be read by a card reader. By requiring a user to actuate a switch included on the smartcard in order to activate the card, it may be possible to prevent certain security attacks against the card such as those initiated surreptitiously by reading a smartcard from a distance without the knowledge, consent, or authorization of the card holder.

However, disadvantages associated with a proposed smartcard having a user-actuated switch is that the resulting cards may include increased manufacturing costs and/or decreased reliability for the smartcard.

BRIEF DESCRIPTION OF THE DRAWINGS

FIG. 6 is an exemplary flow chart illustrating aspects of a method for manufacturing a contactless smartcard, in accordance with some embodiments herein.

DETAILED DESCRIPTION

In general, and for the purpose of introducing concepts of embodiments of the present disclosure, pressure-sensitive operative by sensing pressure from, for example, a user's finger, may be incorporated in a contactless smartcard. The contactless smartcard may include a RFID IC that is activated to an operational state by the switch incorporated into the smartcard. This disclosure provides, for example, a reliable and cost effective method for incorporating a user-actuated switch into a smartcard. Importantly, it allows the switch to be constructed within the inner layers of the card, and then sealed from outside contaminates using the outer layers.

Figure 1:
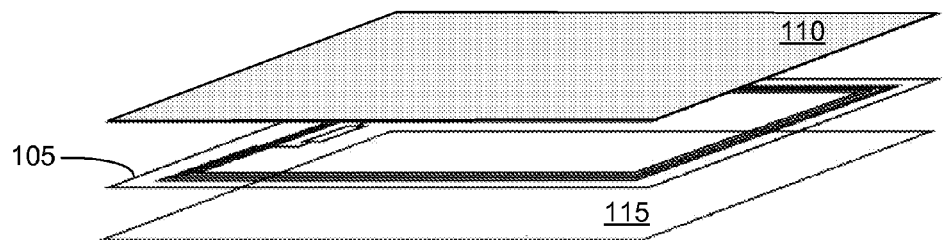
FIG. 1 is a simplified schematic plan view of a contactless smartcard, according to some embodiments herein.

FIG. 1 provides an illustrative depiction of a contactless smartcard 100 including a card inlay 105, a top outer layer 110 on a first side of card inlay 105, and a bottom outer layer 115 on a second side of card inlay 105. Card inlay 105 acts as a carrier for an antenna, a RFID IC, a pressure-sensitive switch, and other associated components as will be described in greater detail below. Card inlay 105 may resemble a payment card shape and size, including those adhering to industry standards regulating the size, shape, and configuration of payment cards. Top outer layer 110 and bottom outer layer 115 may, alone or in combination with other material layers (not shown), cooperate to retain card inlay 105 between top outer layer 110 and bottom outer layer 115. A card lamination process may be used in a manufacturing process of card 100 to fix the relative positioning of top outer layer 110, bottom outer layer 115, and card inlay 105.

It should be recognized that for the economic production of such cards, multiple cards many be produced together from larger sheets of material. Such sheets may be cut or otherwise formed into individual cards after the sheet, as a whole, has progressed through at least some steps of the manufacturing process flow. For the purpose of clarity of this description and not as a limitation, reference is made to a single card. Furthermore, although a limited number of construction layers are depicted, for example three layers are shown in FIG. 1, it should be understood that each layer shown may include a complex construction of several other layers (not shown).

In some embodiments, card inlay 105 may be made of a material that is resistant to deformation when subjected to the heat and pressures present in a card manufacturing process, including those accompanying a lamination process. In some embodiments, card inlay 105 maintains its structural integrity when subjected to even the high heat and high pressures associated with a card lamination process to the extent components such as an antenna, RFID IC, and other components are not absorbed, embedded, or consumed by card inlay 105 when subjected to lamination pressures and heat.

It should be appreciated that the size and shape of card inlay 105 and card 100 in general may be altered, modified, or otherwise changed to accommodate specific uses, implementations, and to conform to relevant standards regarding size, shape, and configuration that are now known and those that become known in the future.

Figure 2:
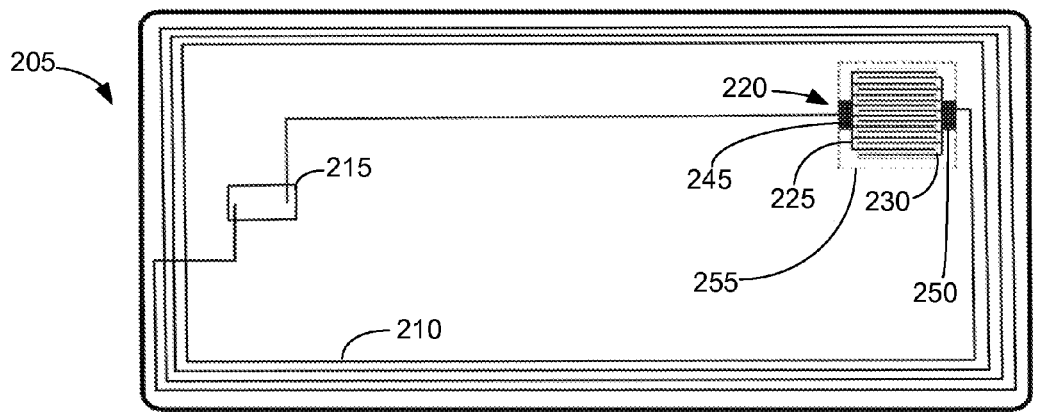
FIG. 2 is schematic plan view of a card inlay, in accordance with some embodiments herein.

FIG. 2 provides a schematic overview of a card inlay 200. Card inlay 200 includes a carrier body 205 that supports an antenna 210, RFID IC 215, and switch electrode structure 220. Carrier body may be flexible, thereby providing a resilient and robust structure that can withstand a card manufacturing process, as well as withstanding the hazards visited upon a card throughout the expected life cycle of the card. In some embodiments herein, antenna 210, RFID IC 215, and switch electrode structure 220 are contained either on or in card inlay 200. In some embodiments, antenna 210 includes several loops or runs of wire or conductive material on card inlay 200. As illustrated, antenna 210 may include several loops of conductive material, printed, etched, deposited, or otherwise positioned on or in card inlay 205. While depicted as being located along a periphery of inlay 205, the exact positioning, size, and configuration of antenna 210 may be altered to accommodate various custom or standard design constraints, as well as operational considerations. As such, the configuration and number of turns of antenna 210 are illustrative, not limiting aspects herein.

Carrier body 205, in some embodiments, is constructed of a material resistant to distortion during manufacturing and the operation pressures, stresses, and heat to which card inlay 200 is likely subjected to during the lamination process. In other embodiments, the carrier body may contain regions where different materials are used to ensure that a particular region is protected from distortion during manufacture. Accordingly, in some embodiments carrier body 205 will resist becoming soft during the card lamination process to an extent that components incorporated into the card carrier are damaged, or structures formed in the card carrier are distorted.

Still referring to FIG. 2, switch electrode structure 220 provides a mechanism to electrically couple RFID IC 215 and antenna 210 together in a switched circuit with a user-actuated switch. In some embodiments, electrode structure 220 is an integral part of the user-actuated pressure-sensitive switch disclosed herein. As shown, electrode structure 220 includes electrodes 225, 230 and contacts 245, 250 connected to RFID IC 215 and antenna 210, respectively. Contacts 245 and 250 provide a mechanism, separate from an antenna wire or trace of antenna 210, to facilitate a reliable electrical contact between RFID IC 215, antenna 210, and the user-actuated pressure-sensitive switch disclosed herein. In some embodiments, the electrical contacts may also provide force concentration through design of their physical profile.

Antenna 210 and RFID IC 215 may be connected to electrode structure 220 by bonding, soldering, a conductive paste, or any other method known now or that becomes known in the future that is compatible with the other aspects of the present disclosure.

In some embodiments, RFID IC 215 may be positioned on card inlay 205 in a location to minimize a potential for capacitive coupling between the conductive trace connecting electrode structure 220 and RFID IC 215 and antenna 210. Accordingly, RFID IC 215 is positioned away from antenna 210 in FIG. 2.

Figure 3:
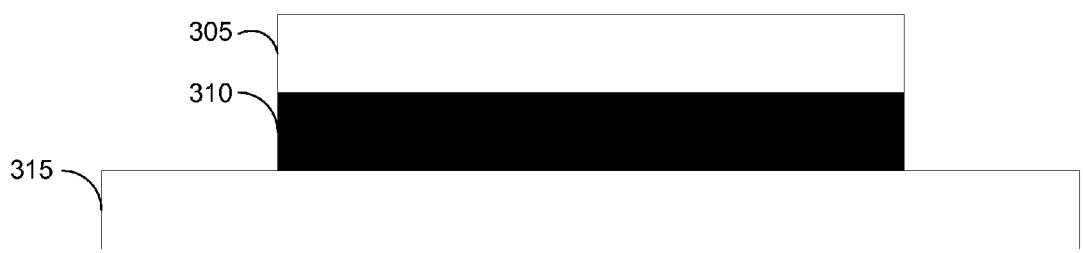
FIG. 3 is an illustrative diagram of a switch, in accordance with some embodiments herein.

FIG. 3 provides an illustrative depiction of a user-actuated pressure-sensitive switch 300 consistent with the present disclosure. In particular, a top electrode structure 305 (similar to electrode 225) and a base electrode 315 (similar to electrode 230) are provided. Positioned between top electrode 305 and base electrode 315 is a layer of material 315 having the characteristic of varying resistance in response to a pressure applied to the material. In some embodiments, material 315 includes a quantum tunneling composite (QTC) that has a lower resistivity when a pressure is applied to it than when a pressure is not applied to the material. Accordingly, a user-actuated pressure-sensitive switch including QTC such as switch 300 is also referred to herein simply as a QTC switch or pressure-sensitive switch.

Figure 4:
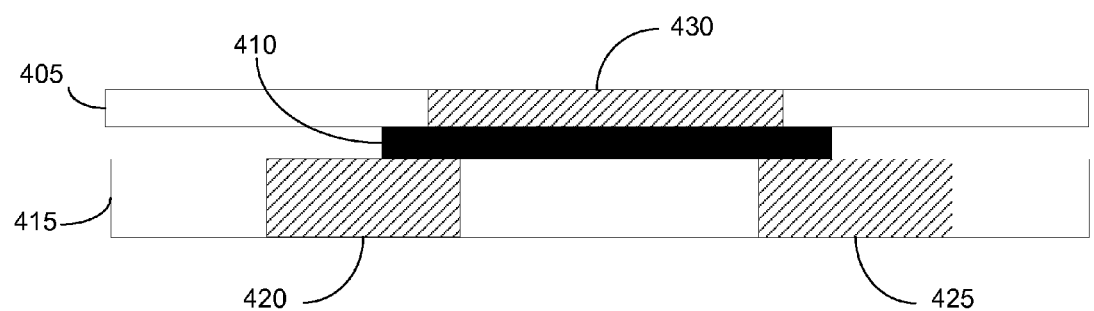
FIG. 4 is an exemplary depiction of a switch having an electrode structure, in accordance with some embodiments herein.

In another embodiment shown in FIG. 4 a pair of electrodes 420 and 425 are located on a common surface 415, though the electrodes are electrically isolated from each other. In some embodiments, the electrodes may be located on either the lower surface 415 or the upper surface 405. Located on surface 405 is an electrode 430 that is normally electrically isolated from the antenna or RFID chip. When a pressure is applied to the switch structure and QTC material 410 starts to conduct, an electrical signal can pass from one of the electrodes connected to the antenna or RFID chip (e.g., 420), through QTC material 410 to isolated electrode 430, and then back through QTC material 410 to electrode 425 connected either to the antenna or RFID IC. This configuration of the electrodes takes advantage of the QTC material's characteristic property to conduct in the vertical direction more freely than the horizontal direction. FIG. 4 illustrates an embodiment wherein the signal need only travel a short distance through the QTC material, and ensures conduction need only occur where force concentration is maximized. In some embodiments, all three electrodes may also provide force concentration through design of their physical profile.

In some embodiments, the pressure-sensitive switch (e.g., switch 300 OR 400) is configured in a stepped configuration in order to avoid or at least minimize a potential for vertical voids in a card construction. The stepped configuration prevents vertical voids from being formed through the majority (i.e., top to bottom) of the card inlay 105, 205, as contrasted with a switch having strictly vertical sides top to bottom.

In some embodiments, pressure-sensitive switch 300 may be formed from a number of constituent parts during the manufacture of the inlay and/or card. In other embodiments, the pressure-sensitive switch may be provided as a distinct assembled component that is provided on or in the card inlay at the appropriate time during the card or card inlay manufacturing process.

In some instances herein, the pressure-sensitive switch is at least partially located in a cavity in card inlay 105, 205. Locating the pressure-sensitive switch at least partially located in a cavity in the card inlay may facilitate producing a card and/or card inlay that does not exceed a maximum card and/or card inlay height restriction. Positioning the switch in a cavity through one or more layers of the card or card inlay may prevent significant voids from occurring in the card or card inlay. Minimizing or eliminating vertical voids contributes to a uniform card or card inlay that meets design and technical specifications.

In some embodiments, a protective barrier or dam of material may be provided in a vicinity around the pressure-sensitive material used in a switch herein. The protective barrier or dam of material may be used to eliminate or otherwise control undesired pressures from being applied to the pressure-sensitive material. In this manner, the sensitivity of the pressure-sensitive material may be maintained at an acceptable and predictable level and the switch can operate in a reliable and predictable manner. Undesired (i.e., stray) pressures acting on the pressure-sensitive material may cause the pressure-sensitive switch to behave in an erratic or otherwise undesired manner. In particular, the protective barrier or dam of material, highlighted by reference number 255 in FIG. 2, may provide a level of protection against lateral pressures on the pressure-sensitive material that my result from a card or card inlay manufacturing process (e.g., lamination operation).

In some embodiments, the layout of the conductive tracks of the top electrode and the base electrode run in opposing parallel tracks, as shown in FIG. 2. In some other embodiments, the layout of the conductive tracks of the top electrode and the base electrode may run perpendicular to each other or some other arrangement in order to increase a greater conductive path through the QTC or other pressure-sensitive conductive material, as shown in FIG. 4. It is noted that the particular layout of the conductive tracks of the top and base electrodes may vary beyond the examples specifically depicted herein.

Figure 5:
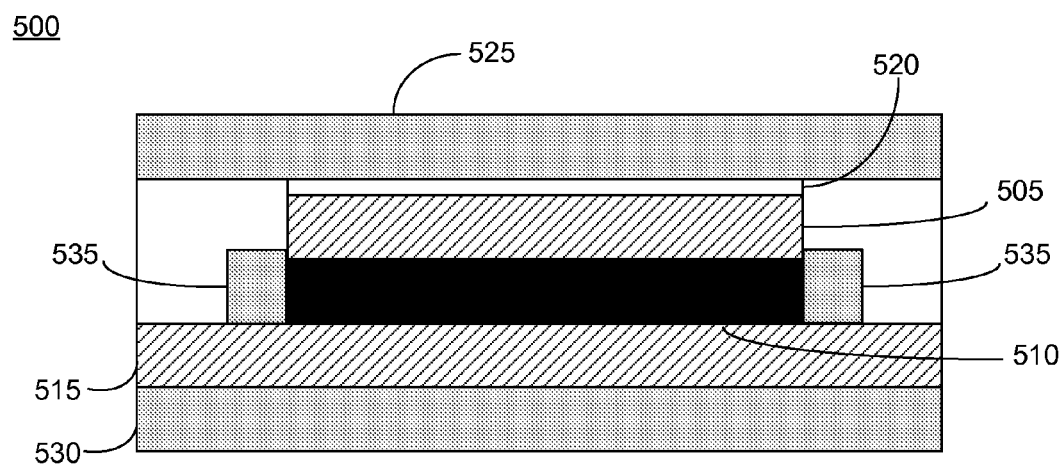
FIG. 5 is a schematic plan view of a contactless smartcard, according to some embodiments herein.

In some embodiments, such as the one depicted in FIG. 5, a layer of material 520 may be provided between an upper (lower) electrode 505 (515) of a pressure-sensitive switch and an upper (lower) outer layer 525 (530) of a card 500. The layer of material 520 may provide a mechanism to keep the upper (lower) outer layer 525 (530) from adhering to or otherwise bonding to the switch that includes a QTC layer 510. The material may be implemented in the form of a tape, film, spray-on application, spacer, etc. In some embodiments, the material be a polyimide film such as Kapton® tape provided by E.I. du Pont de Nemours and Company.

FIG. 5 also illustrates a protective dam of material 535 in the vicinity around QTC layer 510 used in the switch. Protective dam 535 is provided to eliminate or otherwise control undesired pressures from being applied to the QTC pressure-sensitive material so that the sensitivity of the QTC layer may be maintained at an acceptable and predictable level and the switch can operate in a reliable and predictable manner.

FIG. 6 is a flow diagram of a process 600 that may be used in manufacturing a smartcard or card inlay, in agreement with various aspects herein. At operation 605, an antenna and RFID IC are provided on a card inlay. The manufacturing process continues at operation 610 wherein a pressure-sensitive switch is incorporated on or in the card inlay. In some embodiments, the pressure-sensitive switch is able to sense a pressure applied to the switch by virtue of the switch including a material that varies in electrical resistance in response to a pressure applied thereto. The material used in the switch may by a QTC.

At operation 615, the pressure-sensitive switch is connected to the RFID IC and antenna via an electrode structure. The electrode structure provides a mechanism to efficiently and reliably make an electrical connection between the switch, the antenna, and the RFID IC without, for example, compromising the integrity of the antenna or adding to the cost of the card by requiring specialty antenna wire.

At operation 620, a force concentrator is provided so that a user supplied force intended to actuate the switch can be focused onto the pressure-sensitive material. In this manner, an excessive amount of force need not be exerted onto the switch to actuate the switch. This in turn, may increase the reliability and/or life cycle of the switch, card, or card inlay. The force concentrator may comprise one or more force concentrators. In some embodiments, each of two electrodes of the electrode structure may include a force concentrator. The force concentrator may be effectuated based on the construction profile of the electrodes herein.

At operation 625, the card may be laminated using a lamination process. The lamination process may apply a combination of heat and pressure to the card inlay including the antenna, RFID IC, switch, and force concentrator between a top outer layer adjacent a first side of the card inlay and a bottom outer layer adjacent a second side of the card inlay opposing the first side of the card inlay to enclose the card inlay between the top and bottom outer layers.

In some embodiments herein, a card inlay may be produced using some of the operations of process 600. That is, the card inlay may be produced as a separate or pre-stage operation prior to laminating the card inlay into a card during a card laminating process.

By incorporating a pressure-sensitive switch in an inlay in the manner disclosed herein, it may be possible to incorporate a user-actuated switch in a smartcard while minimizing changes in the manufacturing process, and also minimizing increases in manufacturing cost.

Although not specifically indicated in the drawings, one or more of the contactless smartcards herein may have a contact interface like that of a conventional card that includes a contact interface.

In some embodiments, the switch structure of the smartcard may not be connected directly to the antenna circuit, but instead via other circuit paths and/or components to the RFID IC 215. In such cases, RFID IC 215 may not support an antenna or RF interface.

The above description and/or the accompanying drawings are not meant to imply a fixed order or sequence of steps for any process referred to herein; rather any process may be performed in any order that is practicable, including but not limited to simultaneous performance of steps indicated as sequential.

The contactless smartcards may also be applicable to contactless smart cards generally, as well as to so-called "dual interface" smart cards, which contain a set of contacts on a surface of the card to allow for direct contact interface to a terminal. "Dual interface" smart cards also include an antenna to allow for interfacing to a terminal by wireless transmission of signals.

Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

What is claimed is:

1. A radio frequency identification (RFID) card, the card comprising:
   a card inlay;
   an antenna positioned on the card inlay;
   a RFID integrated circuit (IC) on the card inlay;
   a pressure-sensitive switch located on or in the card inlay and coupled to the antenna and the RFID IC via an electrode structure, the pressure-sensitive switch having an electrical resistance that varies with a pressure applied to the switch; and
   a dam of material in a vicinity around of the pressure-sensitive switch to provide a barrier against a lateral pressure being applied to the switch.

2. The card of claim 1, wherein the electrode structure of the pressure- sensitive switch comprises:
   a top electrode; and
   a base electrode separated from the top electrode by pressure sensitive material.

3. The card of claim 2, wherein at least one of the top electrode and the base electrode have a surface profile to act as a force concentrator for a pressure applied the respective electrode.

4. The card of claim 1, wherein the electrode structure of the pressure-sensitive switch comprises:
   a pair of electrodes electrically isolated from each other and located on a common plane, each electrode having a surface profile to act as a force concentrator; and
   a third electrode arranged perpendicular to the pair of electrodes, the third electrode having a surface profile to act as a force concentrator and being separated by pressure sensitive material from the pair of electrodes.

5. The card of claim 1, wherein the electrode structure comprises electrodes of different physically sizes to avoid creating continuous vertical voids through the card structure.

6. The card of claim 1, wherein the card, at least in a region of the card including the pressure-sensitive switch , maintains its dimensional integrity during a card lamination process.

7. The card of claim 6, wherein the region of the card including the pressure-sensitive switch is resistant to deformation due to heat and pressure associated with the card lamination process.

8. The card of claim 1, wherein the card inlay is fully enclosed within outer layers of the card.

9. The card of claim 1, further comprising a layer of material between a top outer layer adjacent a first side of the card inlay and the pressure-sensitive switch, the layer of material preventing the top outer layer adjacent the first side of the card inlay from adhering to the switch.

10. The card of claim 1, wherein the pressure-sensitive switch is at least partially disposed in a cavity in the card inlay.

11. The card of claim 1, wherein the pressure-sensitive switch comprises a quantum tunneling composite (QTC).

12. The card of claim 1, wherein the card inlay includes a plurality of layers of material.

13. A method of manufacturing a radio frequency identification (RFID) card, the method comprising:

providing an antenna and an RFID integrated circuit (IC) on a card inlay;

providing a pressure-sensitive switch including an electrode structure and having an electrical resistance that varies with an applied pressure to the switch on or in the card inlay;

connecting the pressure sensitive switch to the antenna and the RFID IC using the electrode structure;

providing a dam of material in a vicinity around of the pressure-sensitive switch to provide a barrier against a lateral pressure being applied to the switch; and laminating the card inlay including the antenna, RFID IC, and pressure-sensitive switch between a top outer layer adjacent a first side of the card inlay and a bottom outer layer adjacent a second side of the card inlay opposing the first side of the card inlay to enclose the card inlay between the top and bottom outer layers.

14. The method of claim 13, wherein the switch comprises a quantum tunneling composite (QTC).

15. The method of claim 13, further comprising disposing at least part of the switch in a cavity in the card inlay.

16. The method of claim 13, wherein the dam of material does not deform during a lamination process of the card.

17. The method of claim 13, further comprising a layer of material between the top outer layer adjacent the first side of the card inlay and the switch, the layer of material preventing the top outer layer adjacent the first side of the card inlay from adhering to the switch.

18. A card comprising:
a card inlay;
an electrical device positioned on the card inlay;
a source of power for the electrical device;
a pressure-sensitive switch located on or in the card inlay and coupled to the electrical device or between the electrical device and the power source via an electrode structure, the pressure-sensitive switch having an electrical resistance that varies with a pressure applied to the switch; and
a dam of material in a vicinity around of the pressure-sensitive switch to provide a barrier against a lateral pressure being applied to the switch.

19. The card of claim 18, wherein the electrode structure of the pressure-sensitive switch comprises:
a top electrode; and
a base electrode separated from the top electrode by pressure sensitive material.

20. The card of claim 19, wherein at least one of the top electrode and the base electrode have a surface profile to act as a force concentrator for a pressure applied to the respective electrode.

21. The card of claim 18, wherein the electrode structure of the pressure-sensitive switch comprises:
a pair of electrodes electrically isolated from each other and located on a common plane, each electrode having a surface profile to act as a force concentrator; and
a third electrode arranged perpendicular to the pair of electrodes, the third electrode having a surface profile to act as a force concentrator and being separated by pressure sensitive material from the pair of electrodes.

22. The card of claim 18, wherein the electrode structure comprises electrodes of different physical sizes to avoid creating continuous vertical voids through the card structure.

23. The card of claim 18, wherein the card, at least in a region of the card including the pressure-sensitive switch, maintains its dimensional integrity during a card lamination process.

24. The card of claim 23, wherein the region of the card including the pressure-sensitive switch is resistant to deformation due to heat and pressure associated with the card lamination process.

25. The card of claim 18, wherein the pressure-sensitive switch is at least partially disposed in a cavity in the card inlay.

26. The card of claim 18, wherein the pressure-sensitive switch comprises a quantum tunneling composite (QTC).

27. A method of manufacturing a card, the method comprising:
providing an electrical device on a card inlay;
providing a pressure-sensitive switch including an electrode structure and having an electrical resistance that varies with an applied pressure to the switch on or in the card inlay;
connecting the pressure sensitive switch to the electrical device using the electrode structure;
providing a dam of material in a vicinity around of the pressure-sensitive switch to provide a barrier against a lateral pressure being applied to the switch; and
laminating the card inlay including the electrical device and pressure-sensitive switch between a top outer layer adjacent a first side of the card inlay and a bottom outer layer adjacent a second side of the card inlay opposing the first side of the card inlay to enclose the card inlay between the top and bottom outer layers.

28. The method of claim 27, wherein the switch comprises a quantum tunneling composite (QTC).

29. The method of claim 27, further comprising disposing at least part of the switch in a cavity in the card inlay.

30. The method of claim 27, wherein the dam of material does not deform during a lamination process of the card.

* * * * *